(12) United States Patent
Miho

(10) Patent No.: US 7,310,026 B2
(45) Date of Patent: Dec. 18, 2007

(54) SEMICONDUCTOR INTEGRATED CIRCUIT WITH FUNCTION TO DETECT STATE OF STABLE OSCILLATION

(75) Inventor: Akira Miho, Kawasaki (JP)

(73) Assignee: Fujitsu Limited, Kawaski (JP)

( * ) Notice: Subject to any disclaimer, the term of this patent is extended or adjusted under 35 U.S.C. 154(b) by 59 days.

(21) Appl. No.: 11/272,068

(22) Filed: Nov. 14, 2005

(65) Prior Publication Data

US 2006/0197603 A1 Sep. 7, 2006

(30) Foreign Application Priority Data

Mar. 7, 2005 (JP) ............................. 2005-062660

(51) Int. Cl.
*H03L 5/00* (2006.01)
*H03B 1/00* (2006.01)

(52) U.S. Cl. .................... 331/183; 331/64; 331/74; 331/160

(58) Field of Classification Search ............... 331/64, 331/74, 158, 160, 182, 183
See application file for complete search history.

(56) References Cited

U.S. PATENT DOCUMENTS

| | | | | |
|---|---|---|---|---|
| 3,553,531 A | * | 1/1971 | Rimondini et al. | ............ 361/60 |
| 5,369,311 A | * | 11/1994 | Wang et al. | ................ 327/292 |
| 5,673,424 A | * | 9/1997 | Sawamura | .................... 713/500 |
| 6,414,559 B1 | * | 7/2002 | Cole et al. | ................... 331/158 |
| 6,798,301 B1 | * | 9/2004 | Balan et al. | ................... 331/74 |

FOREIGN PATENT DOCUMENTS

JP 2003-216265 A 7/2003

\* cited by examiner

*Primary Examiner*—Benny Lee
*Assistant Examiner*—Ryan J Johnson
(74) *Attorney, Agent, or Firm*—Arent Fox, LLP

(57) ABSTRACT

A semiconductor integrated circuit includes a reference-voltage circuit configured to produce a predetermined reference voltage at an output node thereof, a comparator, coupled to a node to which an oscillating signal is supplied and to the output node of the reference-voltage circuit, to produce a result of comparison at an output node thereof, the result of comparison being made by comparing a voltage of the oscillating signal with the predetermined reference voltage, and a detection circuit coupled to the output node of the comparator to produce, in response to the result of comparison, a stable-state-detection signal indicating that the oscillating signal has an amplitude larger than the reference voltage.

6 Claims, 4 Drawing Sheets

SEMICONDUCTOR INTEGRATED CIRCUIT WITH FUNCTION TO DETECT STATE OF STABLE OSCILLATION

CROSS-REFERENCE TO RELATED APPLICATIONS

The present application is based upon and claims the benefit of priority from the prior Japanese Patent Application No. 2005-062660 filed on Mar. 7, 2005, with the Japanese Patent Office, the entire contents of which are incorporated herein by reference.

BACKGROUND OF THE INVENTION

1. Field of the Invention

The present invention generally relates to semiconductor integrated circuits, and particularly relates to a semiconductor integrated circuit which operates based on an oscillating signal generated by an oscillator.

2. Description of the Related Art

In many types of semiconductor integrated circuits, operations are controlled based on a clock signal that is generated by an oscillator. In order to generate a highly precise clock signal, a crystal oscillator is typically used. A crystal oscillator oscillates with highly precise oscillating frequency by utilizing a resonance effect of an external quartz resonator. Such crystal oscillator is typically 1000 times or more accurate than RC oscillator circuits, and also exhibits low temperature dependency of frequency.

Immediately after a semiconductor integrated circuit is powered on, the oscillating signal is not yet stable because the oscillation of the oscillator has just begun. The amplitude of the oscillating signal is not sufficient during this waiting period before the stabilization of oscillation, and the oscillation waveform may easily be disturbed. If the oscillating signal in such a state is used as a clock signal in the semiconductor integrated circuit, the circuit may be running a risk of suffering malfunction.

In order to avoid such circuit malfunction, provision may be made to start the operation of the semiconductor integrated circuit after waiting for the oscillating signal of the oscillator to stabilize. Conventional technologies for waiting for the oscillating signal of an oscillator to stabilize include a semiconductor integrated circuit in which a timer and a stabilization-wait-setting register are provided, with the output of the timer being compared with the content of the stabilization-wait-setting register. In this configuration, a check is made to determine whether the time lapse indicated by the output of the timer exceeds the time setting stored in the stabilization-wait-setting register. If the time lapse exceeds the time setting, operation is allowed to start by resetting an internal reset of the semiconductor integrated circuit based on the premise that a sufficient time lapse is observed.

Further, Japanese Patent Application Publication No. 2003-216265 discloses a configuration that detects the stabilization of oscillation by use of an oscillation amplitude detecting means. This oscillation amplitude detecting means detects that the oscillation amplitude exceeds a predetermined level by utilizing a threshold of a buffer circuit.

In oscillation circuits, the oscillation stabilization time, which is a time length required for the stabilization of oscillation, differs depending on individual products and operation environments due to differences in resonator characteristics and operation conditions. The above-noted configuration that compares the output of a timer with the content of a stabilization-wait-setting register does not take into account such variations depending on individual products or operation environments, and sets aside a fixed time length as the time length required for the stabilization of the amplitude. Accordingly, a small margin, if used, cannot guarantee reliable operation, and a large margin, if used for the purpose of securing sufficient reliability, results in a needless wait time being increased.

Accordingly, there is a need for a semiconductor integrated circuit which can reliably detect the state of stable oscillation without being affected by a shortening/elongating of the oscillation stabilization time due to differences in individual products and operation environments.

SUMMARY OF THE INVENTION

It is a general object of the present invention to provide a semiconductor integrated circuit that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor integrated circuit particularly pointed out in the specification in such full, clear, concise, and exact terms as to enable a person having ordinary skill in the art to practice the invention.

To achieve these and other advantages in accordance with the purpose of the invention, the invention provides a semiconductor integrated circuit which includes a reference-voltage circuit configured to produce a predetermined reference voltage at an output node thereof, a comparator, coupled to a node to which an oscillating signal is supplied and to the output node of the reference-voltage circuit, to produce a result of comparison at an output node thereof, the result of comparison being made by comparing a voltage of the oscillating signal with the predetermined reference voltage, and a detection circuit coupled to the output node of the comparator to produce, in response to the result of comparison, a stable-state-detection signal indicating that the oscillating signal has an amplitude larger than the reference voltage.

Further, a method of canceling a reset of a semiconductor integrated circuit according to the present invention includes generating a predetermined reference-voltage, comparing a voltage of an oscillating signal with the predetermined reference voltage, asserting, in response to a result of the comparison, a stable-state-detection signal indicating that the oscillating signal has an amplitude larger than the predetermined reference voltage; and canceling a reset of a core circuit in response to the assertion of the stable-state-detection signal.

According to at least one embodiment of the present invention, the amplitude of the oscillating signal is compared with the predetermined reference voltage to determine whether the amplitude of the oscillating signal is sufficiently large such that the oscillation is in a stable state. This makes it possible to reliably detect the state of stable oscillation without being affected by a shortening/elongating of the oscillation stabilization time due to differences in individual products and operation environments.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 1:
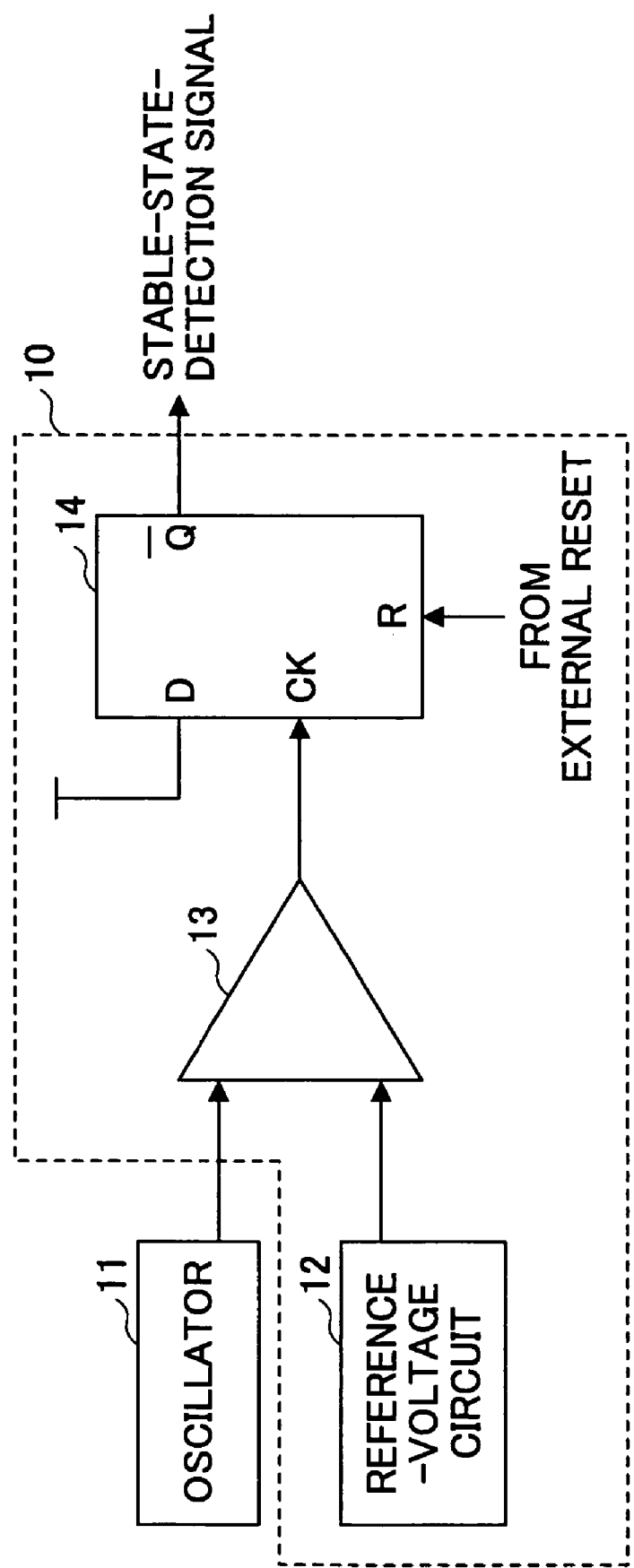
FIG. 1 is a drawing showing an example of the configuration of an oscillating-signal-stable-state detecting circuit according to the present invention.

FIG. 1 is a drawing showing an example of the configuration of an oscillating-signal-stable-state detecting circuit according to the present invention. An oscillating-signal-stable-state detecting circuit 10 of FIG. 1 serves to determine whether the oscillating signal generated by an oscillator 11 has stabilized, and includes a reference-voltage circuit 12, a comparator 13, and a flip-flop 14.

The oscillator 11 may be a crystal oscillator, for example, and may be provided as a built-in component in the semiconductor integrated circuit to which the present invention is applied. If precision as high as that of a crystal oscillator is not required, a ceramic oscillator or the like may be used according to the application. Immediately after the semiconductor integrated circuit is powered on, the oscillating signal is not stable because the oscillation of the oscillator 11 has just begun. The amplitude of the oscillating signal is not sufficient during this waiting period before the stabilization of oscillation, and the oscillation waveform may easily be disturbed. If the oscillating signal in such a state is used as a clock signal in the semiconductor integrated circuit, the semiconductor integrated circuit may be running a risk of suffering malfunction.

In order to avoid such system malfunction, provision needs to be made to start the operation of the semiconductor integrated circuit after waiting for the oscillating signal of the oscillator 11 to stabilize. The oscillating-signal-stable-state detecting circuit 10 according to the present invention compares the amplitude of the oscillating signal generated by the oscillator 11 with a predetermined reference voltage, thereby determining whether the amplitude of the oscillating signal is sufficiently large in the stabilized state.

The reference-voltage circuit 12 of the oscillating-signal-stable-state detecting circuit 10 serves to generate the reference voltage for comparison. The reference voltage generated by the reference-voltage circuit 12 is supplied to one input of the comparator 13. The other input of the comparator 13 receives the oscillating signal generated by the oscillator 11. The comparator 13 compares the oscillating signal generated by the oscillator 11 with the reference voltage generated by the reference-voltage circuit 12, and sets its output to HIGH, for example, if the oscillating signal exceeds the reference voltage. The output of the comparator 13 is supplied to a clock input terminal CK of the flip-flop 14.

The flip-flop 14 is a D-flip-flop. The flip-flop 14 latches a signal supplied to its data input terminal D in response to a rising edge of the signal supplied to the clock input terminal CK. In this case, the data input terminal D is fixedly set to HIGH, so that the flip-flop 14 latches HIGH in response to a rise of the signal supplied from the comparator 13 to the clock input terminal CK. Immediately after the power-on, the flip-flop 14 is in the reset state (the state in which LOW is stored) owing to an external reset signal applied to its reset input R.

As the flip-flop 14 latches HIGH, its inverted output /Q becomes LOW. The change to LOW of the inverted output /Q serves to cancel the internal reset of the semiconductor integrated circuit, thereby allowing its operation to start. This inverted output /Q (or non-inverted output Q (not shown)) serves as a stable-state detection signal indicative of the detection of a stable state of the oscillating signal.

Figure 2:
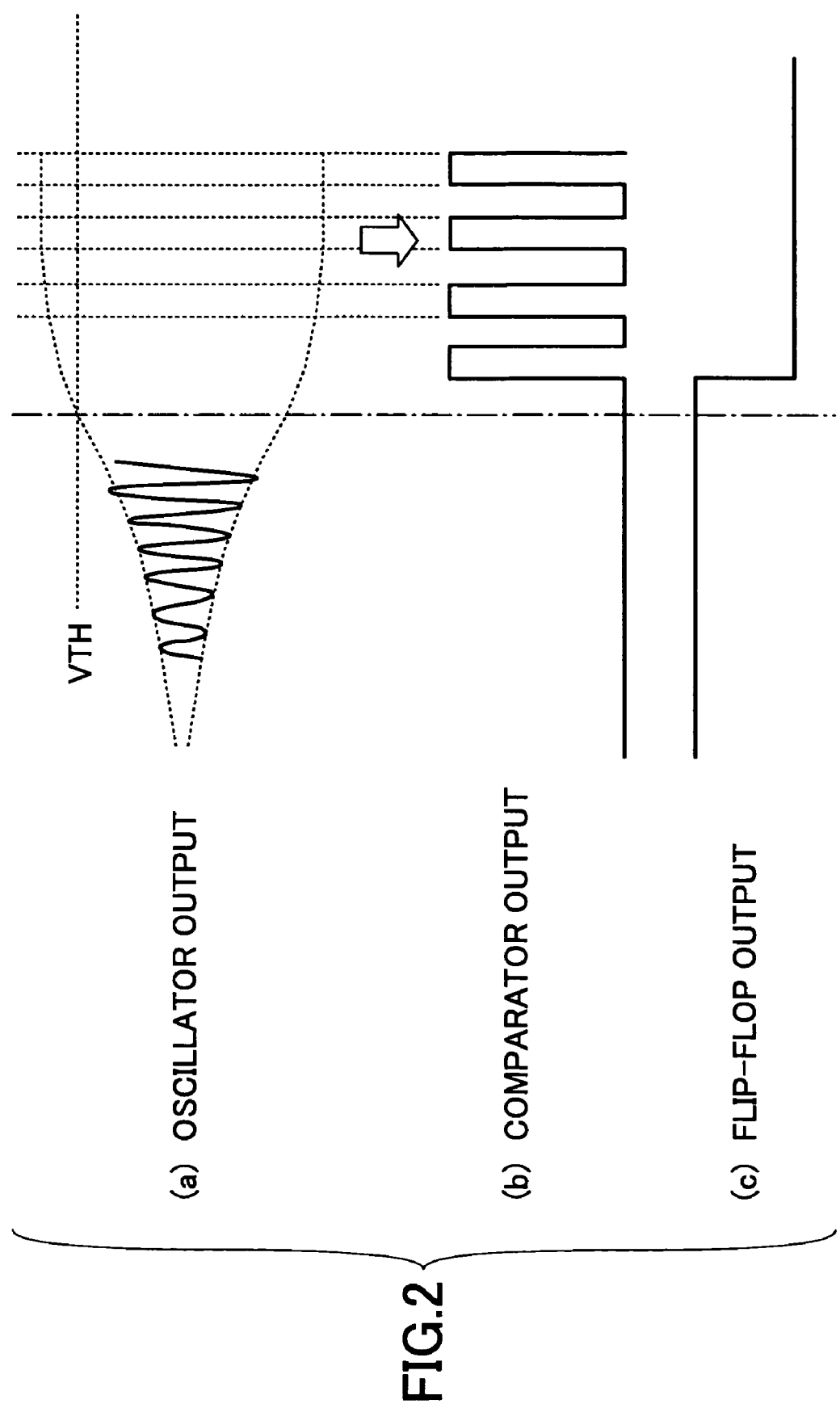
FIG. 2 is a drawing for explaining the circuit operation of the oscillating-signal-stable-state detecting circuit shown in FIG. 1.

FIG. 2 is a drawing for explaining the circuit operation of the oscillating-signal-stable-state detecting circuit 10 shown in FIG. 1. In FIG. 2, a letter designation (a) illustrates the oscillating signal output of the oscillator 11, a letter designation (b) the comparison result output of the comparator 13, and a letter designation (c) the inverted output of the flip-flop 14. In FIG. 2-(a), a reference voltage VTH generated by the reference-voltage circuit 12 is also illustrated in addition to the oscillating signal output of the oscillator 11.

Immediately after the power-on of the semiconductor integrated circuit, the oscillator output shown in (a) has a small amplitude, and has not yet reached a stable oscillation state. At this time, the oscillator output is lower than the reference voltage VTH at all times, so that the comparator output shown in (b) stays LOW. The flip-flop output shown in (c) is thus HIGH.

As time passes thereafter, the oscillator output shown in (a) gradually increases in amplitude. When the amplitude is sufficiently large so that the oscillator output exceeds the reference voltage VTH, the comparator output shown in (b) becomes HIGH. Since the oscillator output being compared with the reference voltage VTH is oscillating, the comparator output shown in (b) alternates between HIGH and LOW like a clock signal after the amplitude of the oscillator output becomes sufficiently large.

In response to a first rising edge of the comparator output shown in (b), the flip-flop output shown in (c) changes from HIGH to LOW. Such LOW state of the flip-flop output indicates that the oscillating signal is in a sufficiently stable state.

Attention may be directed to the fact that the reference voltage generated by the reference-voltage circuit 12 also rises from zero voltage upon power-on of the semiconductor integrated circuit. The reference-voltage circuit 12 is comprised of a potential divider that divides an external power supply voltage by use of resistance division, for example. A time length required for a voltage rise from zero voltage to the predetermined reference voltage VTH is thus far shorter than the time length required for the stabilization of the oscillator 11. Accordingly, fluctuation of the voltage VTH of the reference-voltage circuit 12 at the time of power-on does not adversely affect the operation of the oscillating-signal-stable-state detecting circuit 10.

Figure 3:
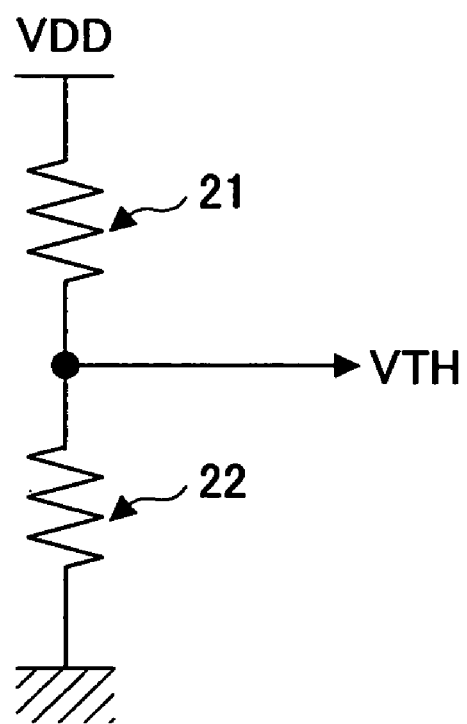
FIG. 3 is a drawing showing an example of the circuit configuration of a reference-voltage circuit.

FIG. 3 is a drawing showing an example of the circuit configuration of the reference-voltage circuit 12. The reference-voltage circuit 12 shown in FIG. 3 includes resistors 21 and 22 connected in series. The series of the resistors 21 and 22 connects between an external power supply voltage VDD and a ground voltage. The joint point between the resistor 21 and the resistor 22 generates the reference voltage VTH. The reference voltage VTH is supplied to one input of the comparator 13 as shown in FIG. 1.

Figure 4:
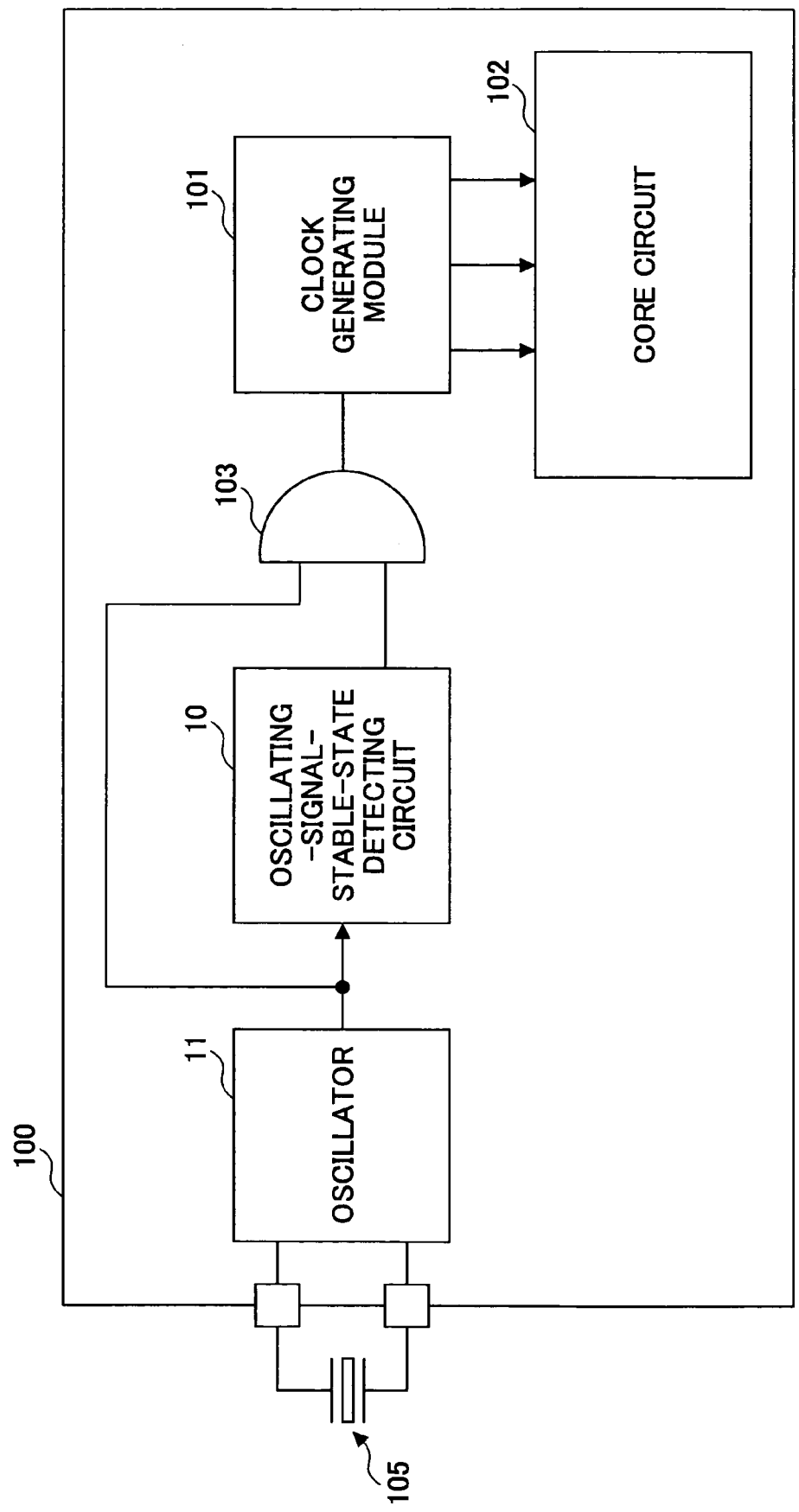
FIG. 4 is a drawing showing an example of the configuration of a semiconductor integrated circuit to which the present invention is applied.

FIG. 4 is a drawing showing an example of the configuration of the semiconductor integrated circuit to which the present invention is applied. In FIG. 4, the same elements as those of FIG. 1 are referred to by the same numerals, and a description thereof will be omitted.

A semiconductor integrated circuit 100 shown in FIG. 4 includes the oscillating-signal-stable-state detecting circuit 10, the oscillator 11, a clock generating module 101, a core circuit 102, and an AND gate 103. External terminals of the semiconductor integrated circuit 100 have a crystal resonator 105 coupled thereto. The oscillator 11 oscillates with predetermined frequency by utilizing a resonance effect of the crystal resonator 105. The oscillating signal generated by the oscillator 11 is supplied to the oscillating-signal-stable-state detecting circuit 10 and the AND gate 103.

The oscillating-signal-stable-state detecting circuit 10 compares the amplitude of the oscillating signal from the oscillator 11 with a predetermined reference voltage, thereby determining whether the oscillating signal has stabilized after the power-on. When the oscillating signal stabilizes, the oscillating-signal-stable-state detecting circuit 10 sets its output signal to HIGH indicating the stable state of the oscillating signal. Namely, the non-inverted output Q, rather than the inverted output /Q, of the flip-flop 14 shown in FIG. 1 may be used as this output.

When the stable-state-detection signal from the oscillating-signal-stable-state detecting circuit 10 is LOW, the AND gate 103 blocks the oscillating signal supplied from the oscillator 11. When the stable-state-detection signal from the oscillating-signal-stable-state detecting circuit 10 becomes HIGH, the AND gate 103 allows the oscillating signal from the oscillator 11 to pass, thereby supplying the oscillating signal to the clock generating module 101.

The clock generating module 101 generates various clock signals based on the stable oscillating signal supplied from the oscillator 11 through the AND gate 103. These clock signals are supplied to the core circuit 102. The core circuit 102 operates based on the clock signals supplied from the clock generating module 101.

In the semiconductor integrated circuit to which the present invention is applied as described above, the amplitude of the oscillating signal from the oscillator 11 is compared with the predetermined reference voltage, thereby determining whether the oscillating signal has become stable after the power on. Upon the detection of a stable state, a stable oscillating signal is supplied to the clock generating module 101 for generation of clock signals. This provides for stable circuit operations to be performed based on stable clock signals.

The configuration shown in FIG. 4 is merely an example of the semiconductor integrated circuit to which the present invention is applied, and a configuration for canceling the reset of the core circuit is not limited to such illustrated configuration. A reset input terminal may be provided for the core circuit, and a reset signal applied to this reset input terminal may be disabled in response to the stable-state-detection signal supplied from the oscillating-signal-stable-state detecting circuit 10.

Further, the present invention is not limited to these embodiments, but various variations and modifications may be made without departing from the scope of the present invention.

What is claimed is:

1. A semiconductor integrated circuit, comprising:
   a reference-voltage circuit configured to produce a predetermined reference voltage at an output node thereof;
   a comparator, coupled to a node to which an oscillating signal is supplied and to the output node of said reference-voltage circuit, to produce a result of comparison at an output node thereof, the result of comparison being made by comparing a voltage of the oscillating signal with the predetermined reference voltage; and
   a detection circuit coupled to the output node of the comparator to produce, in response to the result of comparison, a stable-state-detection signal indicating that the oscillating signal has an amplitude larger than the reference voltage,
   wherein said detection circuit includes a flip-flop circuit configured to latch a predetermined signal level in response to the result of comparison.

2. The semiconductor integrated circuit as claimed in claim 1, further comprising an oscillator configured to supply the oscillating signal to said node to which the oscillating signal is supplied.

3. The semiconductor integrated circuit as claimed in claim 1, wherein said reference-voltage circuit includes a resister series comprised of a plurality of resistors connected in series.

4. A semiconductor integrated circuit, comprising:
   a reference-voltage circuit configured to produce a predetermined reference voltage at an output node thereof;
   a comparator, coupled to a node to which an oscillating signal is supplied and to the output node of said reference-voltage circuit, to produce a result of comparison at an output node thereof, the result of comparison being made by comparing a voltage of the oscillating signal with the predetermined reference voltage;
   a detection circuit coupled to the output node of the comparator to produce, in response to the result of comparison, a stable-state-detection signal indicating that the oscillating signal has an amplitude larger than the reference voltage; and
   a core circuit configured to have a reset state thereof being cancelled in response to the stable-state-detection signal.

5. A semiconductor integrated circuit, comprising:
   a reference-voltage circuit configured to produce a predetermined reference voltage at an output node thereof;
   a comparator, coupled to a node to which an oscillating signal is supplied and to the output node of said reference-voltage circuit, to produce a result of comparison at an output node thereof, the result of comparison being made by comparing a voltage of the oscillating signal with the predetermined reference voltage;
   a detection circuit coupled to the output node of the comparator to produce, in response to the result of comparison, a stable-state-detection signal indicating that the oscillating signal has an amplitude larger than the reference voltage;
   a gate circuit, coupled to said node to which the oscillating signal is supplied to and to an output node of the detection circuit, to control whether to pass or block the oscillating signal in response to the stable-state-detection signal;
   a clock generating circuit, coupled through said gate circuit to said node to which the oscillating signal is supplied to, to produce a clock signal based on the oscillating signal passing through said gate circuit; and a core circuit configured to operate based on the clock signal.

6. A method of canceling a reset of a semiconductor integrated circuit, comprising:

generating a predetermined reference voltage;

comparing a voltage of an oscillating signal with the predetermined reference voltage;

asserting, in response to a result of the comparison, a stable-state-detection signal indicating that the oscillating signal has an amplitude larger than the predetermined reference voltage; and canceling a reset of a core circuit in response to the assertion of the stable-state-detection signal.

* * * * *